(12) United States Patent
Hsu et al.

(10) Patent No.: US 7,656,000 B2
(45) Date of Patent: Feb. 2, 2010

(54) PHOTODETECTOR FOR BACKSIDE-ILLUMINATED SENSOR

(75) Inventors: Tzu-Hsuan Hsu, Kaohsiung (TW); Dun-Nian Yaung, Taipei (TW); Ching-Chun Wang, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 11/753,480

(22) Filed: May 24, 2007

(65) Prior Publication Data

US 2008/0290441 A1 Nov. 27, 2008

(51) Int. Cl.
*H01L 31/00* (2006.01)
*H01L 31/062* (2006.01)

(52) U.S. Cl. ..................................... 257/460
(58) Field of Classification Search .................. 257/98, 257/E33.61, E31.129, E31.001, E27.133, 257/219, 225, 79, 291–294, E27.082–E27.083, 257/460–462, 732, 432, 228, 21, 53, 80, 257/81, 83, 88, 184, 232–233; 438/60, 75, 438/144
See application file for complete search history.

(56) References Cited

U.S. PATENT DOCUMENTS

| | | |
|---|---|---|
| 4,154,632 A | 5/1979 | Mochizuki et al. |
| 4,193,826 A | 3/1980 | Mochizuki et al. |
| 4,199,386 A | 4/1980 | Rosnowski et al. |
| 4,290,830 A | 9/1981 | Mochizuki et al. |
| 4,507,674 A | 3/1985 | Gaalema |
| 4,760,031 A | 7/1988 | Janesick |
| 5,005,063 A | 4/1991 | Janesick |
| 5,244,817 A | 9/1993 | Hawkins et al. |
| 5,511,428 A | 4/1996 | Goldberg |
| 6,168,965 B1 | 1/2001 | Malinovich et al. |
| 6,169,319 B1 | 1/2001 | Malinovich et al. |
| 6,227,055 B1 | 5/2001 | Pitzer |
| 6,259,085 B1 | 7/2001 | Holland |
| 6,429,036 B1 | 8/2002 | Nixon et al. |
| 6,504,196 B1 | 1/2003 | Rhodes |
| 6,635,912 B2 | 10/2003 | Ohkubo |
| 6,765,276 B2 | 7/2004 | Fasen et al. |
| 6,821,809 B2 | 11/2004 | Abe et al. |
| 6,884,651 B2 | 4/2005 | Toyoda et al. |
| 6,946,352 B2 | 9/2005 | Yaung |
| 2001/0012225 A1* | 8/2001 | Rhodes ....................... 365/200 |

(Continued)

FOREIGN PATENT DOCUMENTS

CN 1877845 A 12/2006

OTHER PUBLICATIONS

Williams, George M., "Back-Illuminated CCD Imagers for High Information Content Digital Photography", SPIE, vol. 3302, Apr. 1998, pp. 39-53.

(Continued)

*Primary Examiner*—Dao H Nguyen
*Assistant Examiner*—Tram H Nguyen
(74) *Attorney, Agent, or Firm*—Haynes and Boone, LLP

(57) ABSTRACT

A backside-illuminated sensor including a semiconductor substrate. The semiconductor substrate has a front surface and a back surface. A plurality of pixels are formed on the front surface of the semiconductor substrate. At least one pixel includes a photogate structure. The photogate structure has a gate that includes a reflective layer.

19 Claims, 5 Drawing Sheets

U.S. PATENT DOCUMENTS

| | | | |
|---|---|---|---|
| 2001/0017344 A1* | 8/2001 | Aebi | 250/214 VT |
| 2004/0169625 A1 | 9/2004 | Park et al. | |
| 2004/0178350 A1* | 9/2004 | Nagano et al. | 250/370.11 |
| 2005/0090035 A1 | 4/2005 | Kim | |
| 2005/0184322 A1* | 8/2005 | Inoue | 257/292 |
| 2005/0287479 A1 | 12/2005 | Moon | |
| 2006/0057759 A1 | 3/2006 | Zhang et al. | |
| 2006/0121640 A1 | 6/2006 | Kim | |
| 2006/0197171 A1 | 9/2006 | Zhang et al. | |
| 2006/0267123 A1 | 11/2006 | Wu et al. | |
| 2006/0275945 A1 | 12/2006 | Yang et al. | |
| 2007/0001100 A1 | 1/2007 | Hsu et al. | |
| 2007/0108476 A1* | 5/2007 | Hong | 257/225 |
| 2007/0117253 A1 | 5/2007 | Hsu et al. | |
| 2007/0207566 A1 | 9/2007 | Fu et al. | |

OTHER PUBLICATIONS

Chinese Office Action issued Mar. 20, 2009, Application No. 2007101487965.

* cited by examiner

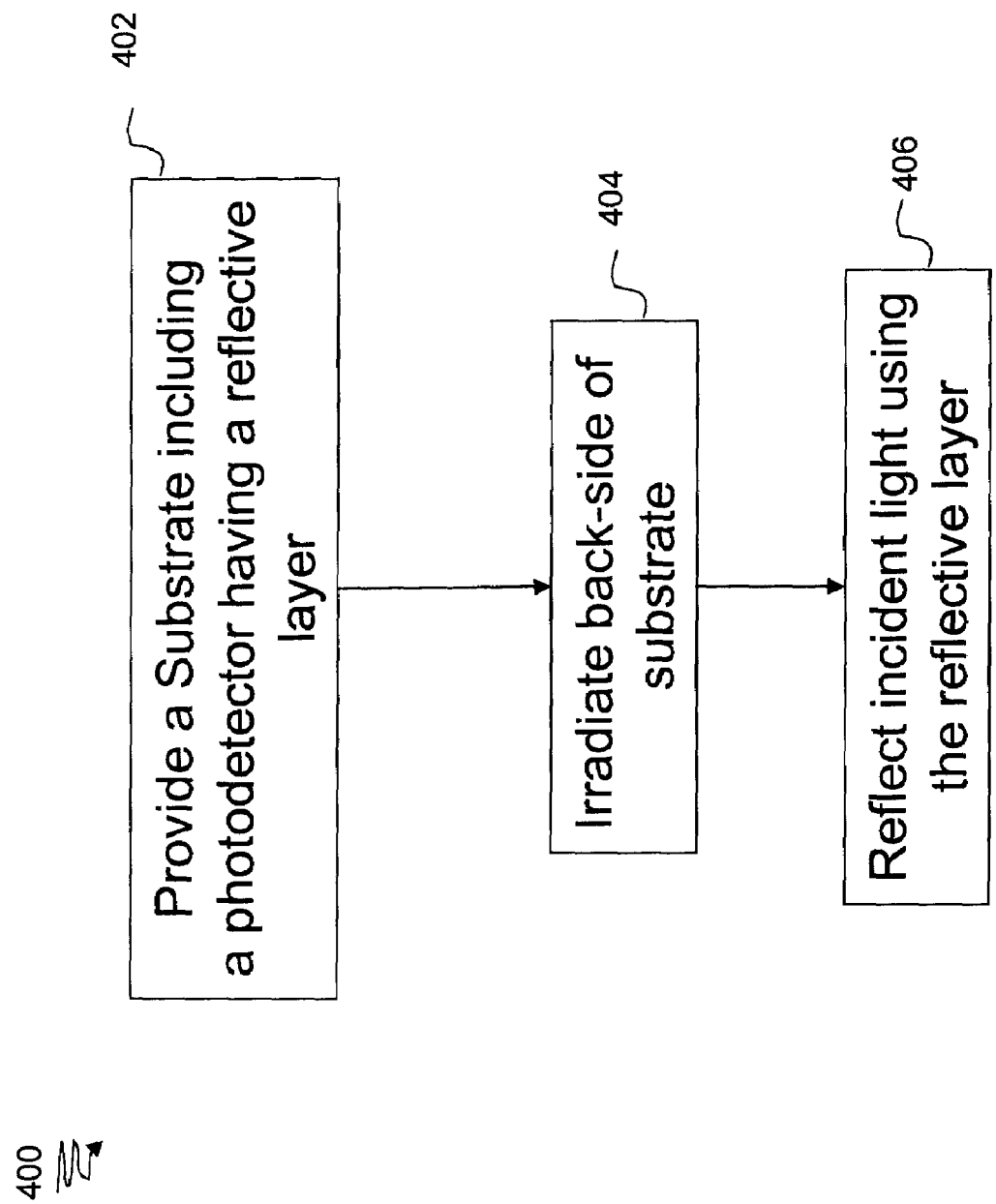

PHOTODETECTOR FOR BACKSIDE-ILLUMINATED SENSOR

BACKGROUND

The present disclosure relates generally to image sensors and, more particularly, to complementary metal-oxide semiconductor (CMOS) image sensors (CIS).

CMOS image sensors are widely used in various applications such as digital camera applications. They are used for sensing a volume of exposed light projected towards a semiconductor substrate. To do this, the image sensors use an array of pixels, or image sensor elements, to collect photo energy to convert images into electrical signals that can be used in a suitable application. A CIS pixel includes a photodetector such as a photodiode, photogate detector, or phototransistor, to collect photo energy.

One form of CIS, backside-illuminated (BSI) sensors, sense a volume of light projected towards the backside surface of the substrate of the sensor by using pixels located on the front side of the substrate. The substrate must be thin enough that light projected towards the backside of the substrate can reach the pixels. Backside-illuminated sensors are advantageous in that they provide higher fill factor and reduced destructive interference. A thin substrate is required to reduce crosstalk. However, a thin substrate also degrades the quantum efficiency of the image sensor. The quantum efficiency includes the capability of the sensor to convert light into a signal (including the response of the sensor to different wavelengths of light). In particular, the quantum efficiency of a backside-illuminated sensor may be compromised for light having a long wavelength. For instance, the quantum efficiency may decrease 20-50% for red light.

There are further disadvantages to conventional CIS, including BSI sensors. For instance, they may suffer from noise, such as "kTC noise" (the nomenclature taken from the equation used to calculate the noise level). The noise level includes a measurement of the accuracy with which the incident light can be measured. The noise level is dependent on the type of photodetector on the CIS. A CIS with a photogate type photodetector may have lower noise than a CIS with a photodiode type photodetector. However, a conventional CIS with a photogate type photodetector can suffer from degradations in sensitivity, as incident light is not fully captured by the sensor.

As such, an improved backside-illuminated image sensor is desired.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 4 is a flowchart illustrating an embodiment of operating a backside-illuminated sensor.

DETAILED DESCRIPTION

The present disclosure relates generally to image sensors and more particularly, to a backside-illuminated image sensor. It is understood, however, that specific embodiments are provided as examples to teach the broader inventive concept, and one of ordinary skill in the art can easily apply the teaching of the present disclosure to other methods or apparatus. In addition, it is understood that the methods and apparatus discussed in the present disclosure include some conventional structures and/or processes. Since these structures and processes are well known in the art, they will only be discussed in a general level of detail. Furthermore, reference numbers are repeated throughout the drawings for sake of convenience and example, and such repetition does not indicate any required combination of features or steps throughout the drawings. Moreover, the formation of a first feature over and on a second feature in the description that follows may include embodiments in which the first and second features are formed in direct contact, and may also include embodiments in which additional features may be formed interposing the first and second features, such that the first and second features may not be in direct contact. Also, the formation of a feature on a substrate, or on a surface of a substrate, may include embodiments where features are formed above the surface of the substrate, adjacent to the surface of the substrate, directly on the surface of the substrate, and/or extending below the surface of the substrate (such as implanted regions).

Figure 1:
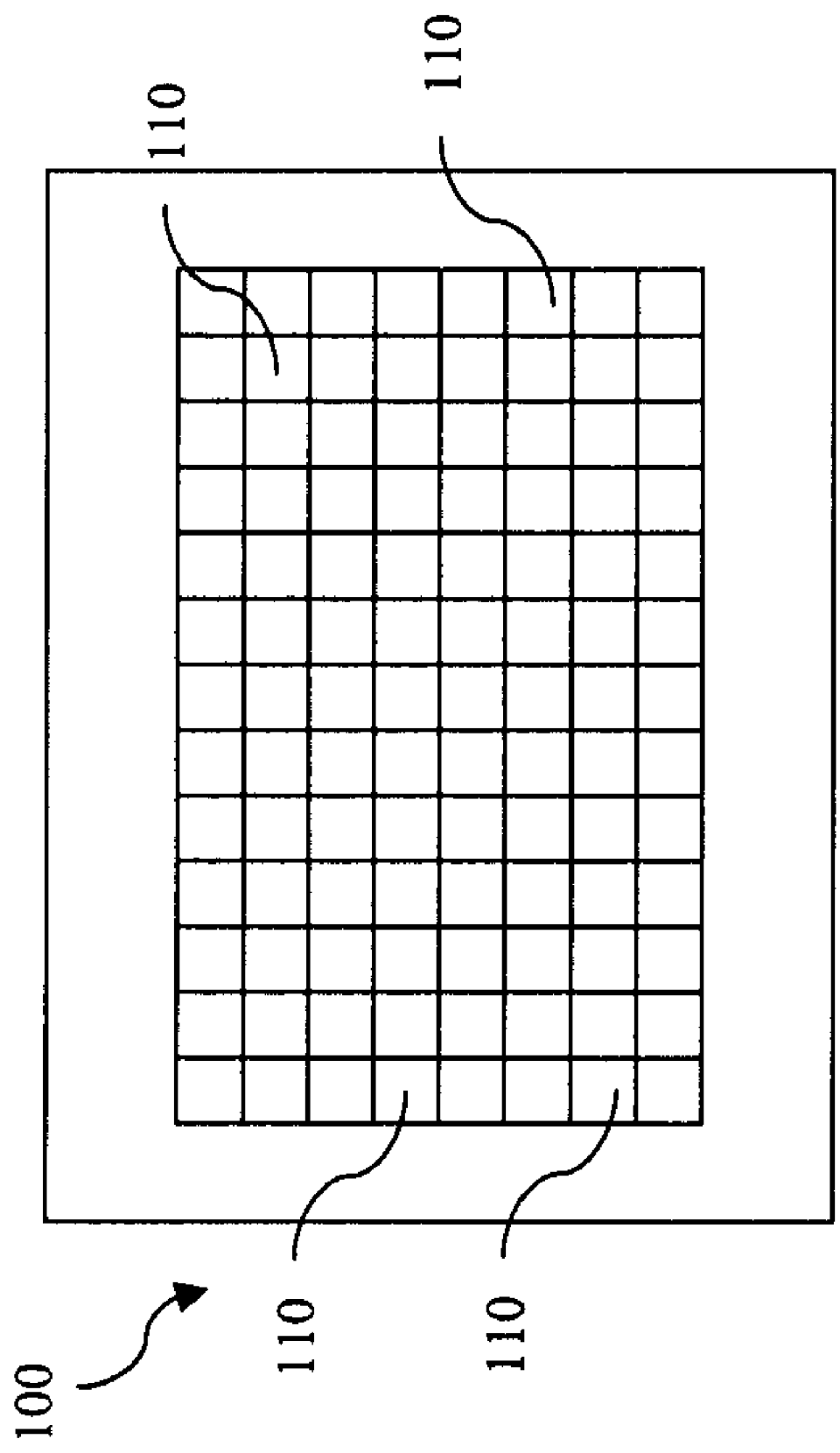
FIG. 1 is a top view of a sensor device including a plurality of pixels.

Referring to FIG. 1, an image sensor device 100 provides an array of pixels 110. The image sensor device 100 is a complimentary metal oxide semiconductor (CMOS) image sensor (CIS) or active pixel sensor. The image sensor device 100 is also a backside-illuminated (BSI) sensor. The pixels 110 include photodetectors for recording an intensity or brightness of light. In an embodiment, the photodetectors include photogate type photodetectors. The pixels 110 may also include reset transistors, source follower transistors, selector transistors, and/or transfer transistors. Additional circuitry and input/outputs are typically provided adjacent to the array of pixels 110 for providing an operation environment for the pixels 110 and for supporting external communications with the pixels 110. For simplicity, image sensors including a single pixel are described in the present disclosure; however, typically an array of such pixels may form a sensor as illustrated in FIG. 1.

Figure 2:
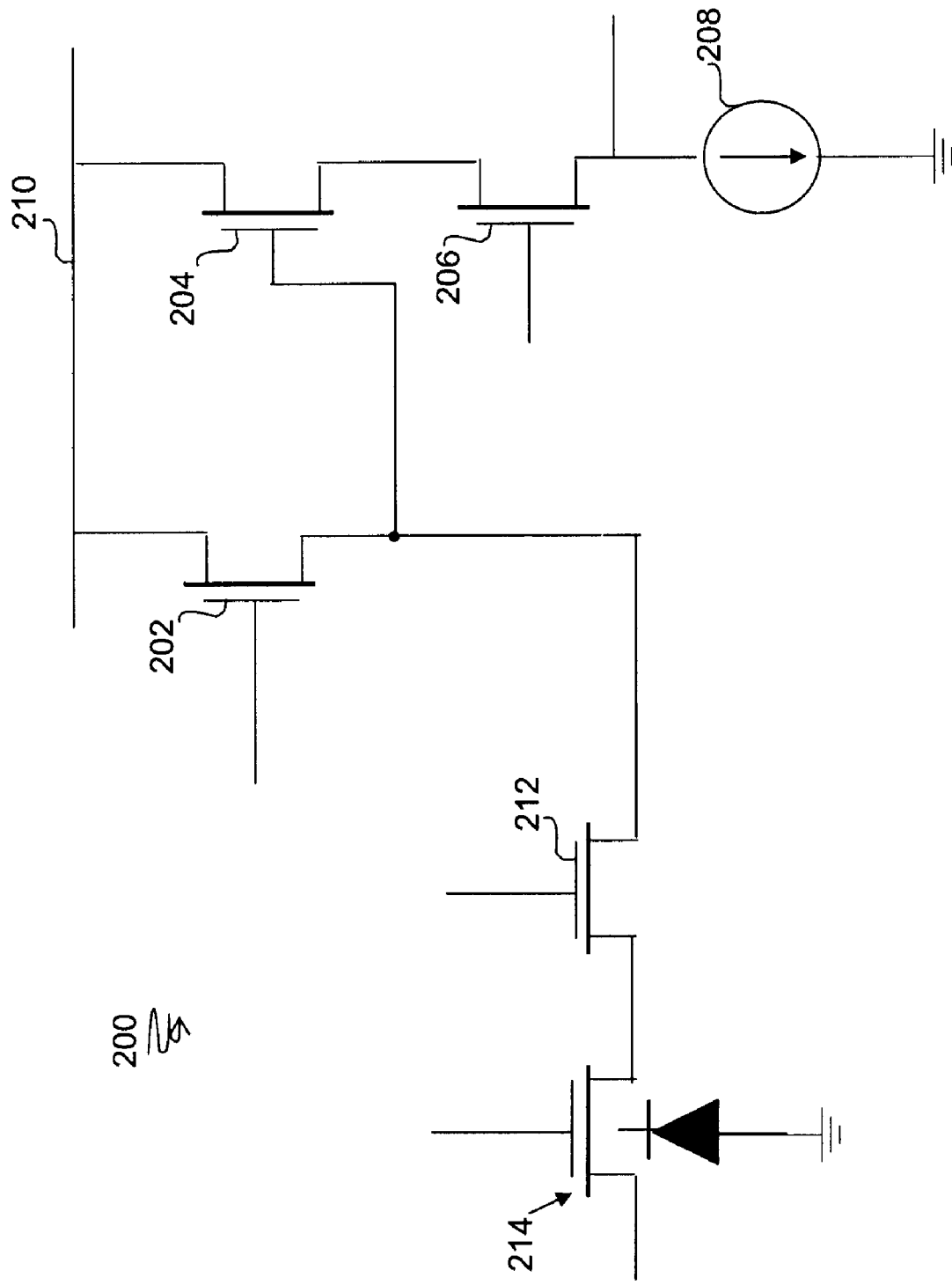
FIG. 2 is a schematic of an embodiment of a CIS with a photogate type photodetector.

Referring now to FIG. 2, a schematic of an embodiment of a pixel or image sensor element 200 is illustrated. The image sensor element 200 includes a reset transistor 202, a source follower transistor 204, a selector transistor 206, a transfer transistor 212 (or transfer gate transistor), and a photodetector 214. The photodetector 214 is connected in series with the transfer transistor 212. The transfer transistor 212 is connected in series with the reset transistor 202. The gate of the source follower transistor 204 is connected to the source of the reset transistor 202. The drain of the source follower transistor 204 is connected to a power supply 210. The access transistor 206 is connected in series to the source follower transistor 204. The reset transistor 202 can act to reset the image sensor element 200. The source follower transistor 204 may allow the voltage of the sensor element 200 to be observed without removing the accumulated charge. The selector transistor 206 may be a row-select transistor and allow a single row of pixels in a pixel array, such as illustrated in the pixel array of FIG. 1, to be read when the selector transistor 206 is turned on. The drain of the transfer transistor 212, also the source of the reset transistor 202, corresponds to a floating diffusion region, described below with reference to FIG. 3a. The transfer transistor 212 can move signal charges accumulated in the photodetector 214 to the floating diffusion region. As the floating diffusion layer is connected to the gate of the source follower transistor 204, if the access transistor 206 is turned on (i.e. the row is selected), data is output from the pixel. In an embodiment, the transfer transistor 212 allows for correlated double sampling. In the illustrated embodiment, the photodetector 214 is a photogate type photodetector (also known as gate type photodiode or for purposes of this disclosure a photogate structure). The photodetector 214 is coupled to ground. The gate of the photodetector 214 may be coupled such that a voltage can be applied to the gate creating a channel beneath the gate. A constant current source 208 is also included in the image sensor element 200.

Figure 3A:
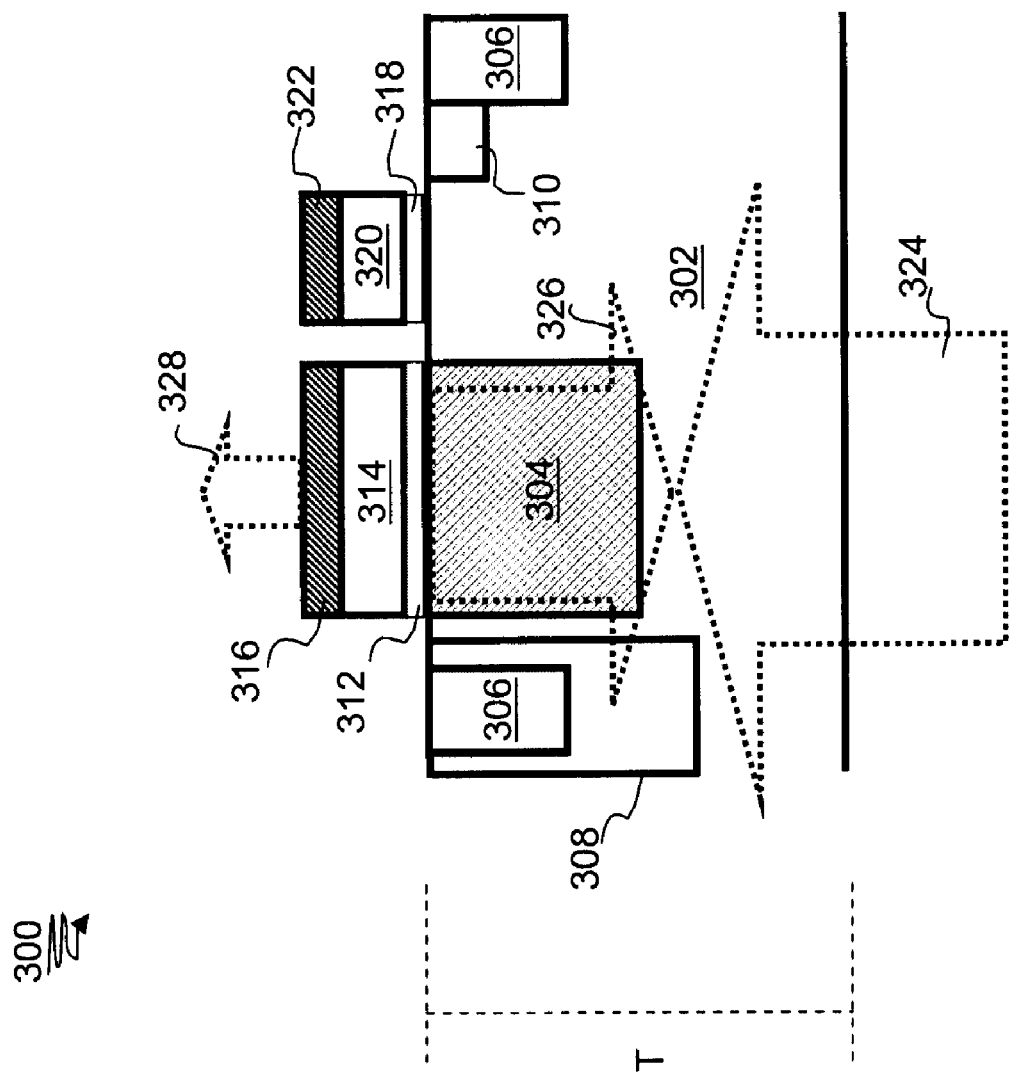
FIG. 3a is a cross-section of an embodiment of a CIS with a photogate type photodetector constructed according to aspects of the present disclosure.

Referring now to FIG. 3a, a cross-section of an embodiment of an image sensor element 300 is illustrated. The image sensor element 300, as illustrated, includes a transfer transistor and a photodetector, as described in detail below. The photodetector includes a photogate structure. It is understood however that the image sensor element 300 may include other various transistors, such as a reset gate transistor, source follower transistor, row selector transistor, and/or other types of transistors known in the art. Furthermore, the image sensor element 300, as illustrated, includes one pixel. Additional pixels may be present, such as described above with reference to FIG. 1.

The image sensor element 300 may be fabricated by CMOS processing techniques known in the art. The image sensor element 300 includes a semiconductor substrate 302. In an embodiment, the substrate 302 is silicon in a crystalline structure. In alternative embodiments, the substrate 302 also includes other elementary semiconductors such as germanium, or includes a compound semiconductor such as silicon carbide, gallium arsenide, indium arsenide, and indium phosphide. In an embodiment, the substrate 302 includes a p-type substrate (p-substrate). The p-substrate may be formed by doping the substrate 302 with a p-type dopant such as boron, $BF_2$, or other suitable material known in the art. The doping may be accomplished using conventional processes such as ion implantation or diffusion. In an embodiment, the semiconductor substrate is between approximately 2 µm and 4 µm in thickness.

The image sensor element 300 further comprises a plurality of isolation features 306. In the illustrated embodiment, the isolation features 306 are shallow trench isolation (STI) features. The isolation features 306 define and isolate active regions for various microelectronic devices of the image sensor element 300. The isolation features 306 may be formed in the substrate 302 by conventional processes such as, patterning the substrate 302 using photolithography, etching the substrate 302 by plasma etching to form a plurality of trenches, and filling the formed trenches with a dielectric material such as silicon oxide. A guard ring well 308 is formed underlying one or more of the isolation features 120. The guard ring well 308 may a p-type well (pwell) formed by doping the substrate 302 with p-type dopants such as, boron, $BF_2$, or other suitable material known in the art. The doping may be accomplished conventional processes known in the art such as ion implantation or diffusion in a region defined by conventional photolithography processes.

The image sensor element 300 further includes a transfer transistor (or transfer gate transistor). The transfer transistor is operable to transfer the photoelectrons generated in the photogeneration region 304, described below, to a floating diffusion region 310 that is the drain of the transfer transistor. The floating diffusion region 310 may be formed in the substrate 302 by ion implantation of n-type dopants such as arsenic, phosphorus, or other suitable materials known in the art. Conventional photolithography methods may be used to pattern the area to be implanted. The transfer transistor includes a gate comprising a gate dielectric layer 318 and gate electrode layers 320 and 322 formed on the substrate 302. In an embodiment, the gate dielectric layer 318 is silicon oxide. Other examples of gate dielectrics include silicon nitride, silicon oxinitride, dielectric with a high dielectric constant (high k), and/or combinations thereof. In an embodiment, the gate electrode includes a polycrystalline silicon layer 320 and a silicide layer 322. The silicide layer 322 may include a silicide, such as nickel silicide, cobalt silicide, tungsten silicide, tantalum silicide, titanium silicide, platinum silicide, erbium silicide, palladium silicide, and/or combinations thereof. In an alternative embodiment, the silicide layer 322 may be absent. The gate of the transfer transistor may be formed by processes such as, photolithography, deposition, etching, annealing, ion implantation, and/or a variety of the processes known in the art. Other materials and gate formation methods are possible.

The image sensor element 300 also includes a photodetector. The photodetector includes a photogate structure, also described above with reference to FIG. 2. The photogate structure includes the photogeneration region 304 and a gate coupled to the photogeneration region 304. The photogeneration region 304 may be formed by ion implantation of the substrate 302 at an area defined by conventional photolithography techniques. In an embodiment, the photogeneration region 304 is an n-type photosensor. In the embodiment, an n-type dopant such as phosphorus, arsenic, or other suitable material known in the art is implanted in the substrate 302.

The gate of the photogate structure includes a gate dielectric layer 312. The gate dielectric layer 312 includes a dielectric material such as, silicon oxide, silicon nitride, silicon oxinitride, dielectric with a high dielectric constant (high k), and/or combinations thereof. Examples of high k materials include hafnium oxide, zirconium oxide, aluminum oxide, hafnium dioxide-alumina ($HfO_2$—$Al_2O_3$) alloy, or combinations thereof. The gate dielectric layer 312 may be formed using conventional processes such as, photolithography, oxidation, deposition, etching, and/or a variety of other processes known in the art.

In one embodiment, the gate of the photogate structure further includes a gate electrode layer 314, which includes doped polycrystalline silicon (polysilicon), and a reflective layer 316 including a silicide. The gate electrode layer 314 may be formed using conventional processes such as, photolithography, ion implantation, deposition, etching, and/or a variety of other processes known in the art. The reflective layer 316 is fabricated on the polysilicon gate electrode layer 314. The gate electrode including polysilicon, layer 314, and silicide, layer 316, may be known as a silicide-poly gate. Examples of silicide that may be included in the reflective layer 316 include nickel silicide, cobalt silicide, tungsten silicide, tantalum silicide, titanium silicide, platinum silicide, erbium silicide, palladium silicide, and/or combinations thereof. The silicide may be formed by processes known in the art. In an embodiment, the silicide is formed by depositing a metal layer including a metal that can form a silicide such as nickel, cobalt, tantalum, titanium, platinum, erbium, palladium, and/or tungsten. The metal may be deposited using conventional processes such as physical vapor deposition (PVD) (sputtering), chemical vapor deposition (CVD), plasma-enhanced chemical vapor deposition (PECVD), atmospheric pressure chemical vapor deposition (APCVD), low-pressure CVD (LPCVD), high density plasma CVD (HDPCVD), or atomic layer CVD (ALCVD). The metal is then annealed to form silicide. The annealing may use a rapid thermal anneal (RTA) in a gas atmosphere such as Ar, He, $N_2$, or other inert gas. A second annealing may be required to make a stable silicide. The un-reacted metal is then removed. In an embodiment, the silicide is formed by a self-aligned silicide process (salicide process). In an embodiment, the reflective layer 316 is formed on the photogate structure concurrently with the silicide 322 of the transfer transistor. The gate of the photogate structure may include additional layers, reflective or non-reflective.

In an alternative embodiment, the gate of the photogate structure is a metal gate. In the embodiment, the gate electrode layer 314 is a metal layer. As such, the gate electrode layer 314 is a reflective layer. Examples of suitable metals that may be included in the gate electrode layer 214 include Cu, W, Ti, Ta, TiN, TaN, NiSi, CoSi, and/or combinations thereof. The gate electrode layer 314 may be formed by methods known in the art. For example, the metal may be deposited by physical vapor deposition (PVD) (sputtering), chemical vapor deposition (CVD), plasma-enhanced chemical vapor deposition (PECVD), atmospheric pressure chemical vapor deposition (APCVD), low-pressure CVD (LPCVD), high density plasma CVD (HDPCVD), or atomic layer CVD (ALCVD). Photolithography steps may be used to pattern the metal layer to form the metal gate and a plasma etch may remove unwanted metal. In an embodiment, the reflective layer 316 is not present. However, additional layers, reflective or non-reflective, may be present on the gate of the photogate structure.

In an alternative embodiment, the gate of the photogate structure is a metal gate, having a reflective, metal gate electrode layer, and the gate further includes a second reflective layer. In the embodiment, the gate electrode layer 314 is a reflective, metal layer substantially as described above with reference to the previous embodiment. A second reflective layer, the reflective layer 316, includes silicide. The reflective layer 316 may be formed on the gate electrode layer 314 or below the gate electrode layer 314. The reflective layer 316 includes a silicide such as nickel silicide, cobalt silicide, tungsten silicide, tantalum silicide, titanium silicide, platinum silicide, erbium silicide, palladium silicide, and/or combinations thereof. The silicide layer may be formed using conventional processes including those described above. Additional layers, reflective or non-reflective, may be present on the gate of the photogate structure.

The image sensor element 300 is a backside-illuminated sensor. The image sensor element 300 is designed to receive radiation directed towards the back surface of the substrate 302, illustrated as radiation beam 324, during applications. Radiation from the backside of the substrate 302 eliminates obstructions to the optical path of the radiation that may be caused by other objects such as gate features and metal lines. Thus, the exposure of the photogeneration region 304 to the radiation beam 324 is increased. The substrate 302 includes a thickness T. The thickness T is such that the radiation beam 324 effectively reaches the photogeneration region 304. In an embodiment, the thickness T of the substrate 302 is approximately 2 µm. In other embodiments, the thickness T of the substrate 302 is between approximately 2 µm and 4 µm. The radiation beam 324 may be a visual light beam, an infrared (IR) beam, an ultraviolet (UV) beam, and/or other proper radiation beam.

The radiation beam 324, incident on the back surface of the substrate 302, passes to and through the photogeneration region 304. A portion of the radiation beam 324 is reflected back to the photogeneration region 304, shown as reflected radiation 326. The reflected radiation 326 is generated from the radiation beam 324 striking a reflective layer included in the gate of the photogate structure. In an embodiment, the reflected radiation 326 is generated from the radiation beam 324 striking the reflective layer 316. In an alternate embodiment, the reflected radiation 326 is generated from the radiation beam 324 striking the gate electrode layer 314. In the embodiment, the gate electrode layer 314 is a reflective layer and included in a metal gate structure of the photodetector. In yet a further embodiment, the reflected radiation 326 is generated from the radiation beam 324 striking both the reflective layer 316 and the gate electrode layer 314, the gate electrode layer 314 also being a reflective layer. A portion of the incident radiation beam 324 may pass through the photogate structure, as illustrated as a pass-through radiation 328.

The larger the pass-through radiation 328, the lower the sensitivity of the image sensor element 300. In a conventional image sensor, the gate structure includes a gate electrode layer of doped polycrystalline silicon and a gate dielectric layer including, for example, silicon oxide, silicon nitride, silicon oxinitride, high k dielectric, and/or combinations thereof. This conventional gate structure, lacking any reflective layer, allows a substantial portion of the incident radiation to pass through the photogate structure decreasing the conventional sensor's sensitivity. Without a reflective layer, little or no incident radiation will be reflected. This is further illustrated in FIG. 3b, described below.

Figure 3B:
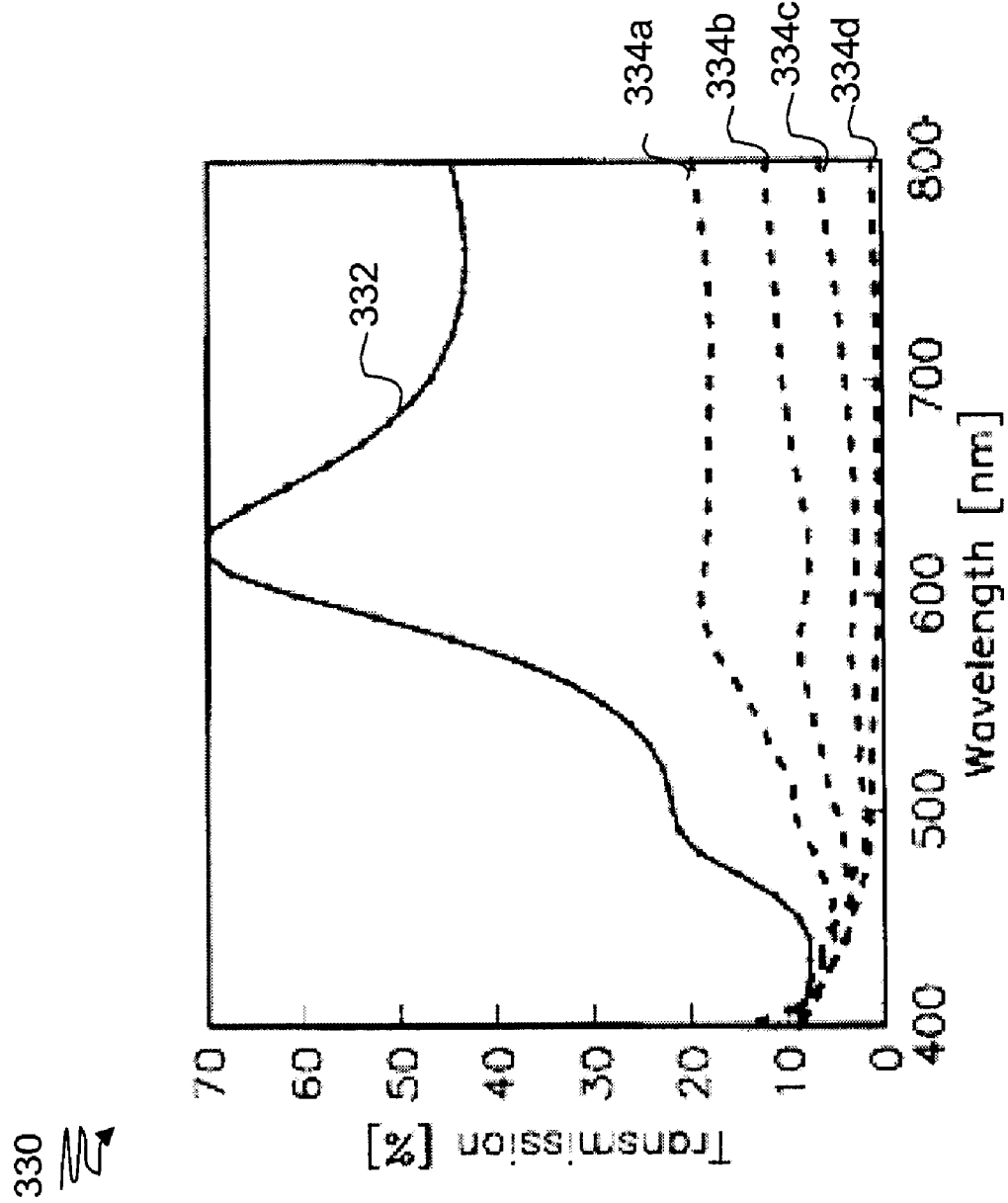
FIG. 3b is a graph of transmission versus wavelength for a plurality photodetectors.

Referring now to FIG. 3b, an example, according to one embodiment, of the transmission of various wavelengths of light for a plurality of photogate structures is illustrated as graph 330. The transmission [%] is illustrated on the y-axis; the wavelength of incident light [nm] is illustrated on the x-axis. The transmission is the percentage of light passing through the photogate structure, such as the pass-through radiation 328 of the image sensor element 300 described above with reference to FIG. 3a. The transmission for various wavelengths of light using a conventional polysilicon photogate structure is plotted giving line 332. The transmission for various wavelengths of light using a plurality of silicide-poly photogate structures, such as those described above with reference to FIG. 3a, are illustrated as lines 334a, 334b, 334c, and 334d. The line 332 illustrates, especially for longer wavelength light, the conventional polysilicon photogate structure provides a high transmission. For example, in the embodiment, for light with approximately 650 nm (i.e. red light) the transmission is approximately 60%. Meanwhile, the photogate structures including a silicide-poly gate provide higher absorption rates. For example, in the embodiment, for light with approximately 650 nm (i.e. red light), the transmission is less than approximately 20%. Thus, addition of a reflective layer, such as silicide, may decrease the transmission, increasing the absorption of radiation, which increases the sensitivity of an image sensor.

Referring now to FIG. 4, illustrated is a method 400 for operating a backside-illuminated sensor. The method 400 begins at step 402 where a substrate having a photodetector including a reflective layer is provided. The substrate provided may be the substrate 302, described above with reference to FIG. 3a. The photodetector may include the photodetector described above with reference to FIG. 3a. The method 400 then proceeds to step 404 where the backside of the substrate is irradiated. The radiation may be a visual light beam, an infrared (IR) beam, an ultraviolet (UV) beam, and/ or other proper radiation beam. The method 400 then proceeds to step 406 where a portion of the radiation is reflected by the reflective layer, such as the reflected radiation 326, described above with reference to FIG. 3*a*. A portion of the radiation may not be reflected but be transmitted through the photodetector, such as the pass-through radiation 328, also described above with reference to FIG. 3*a*. In an embodiment, the transmitted, or pass-through, radiation is less than 20% for wavelengths of light between approximately 400 nm and 800 nm (i.e. red, green, blue light). In an embodiment, the reflective layer increases the absorption rate of the photodetector. In an embodiment, a thinner substrate including a reflective layer in the gate of the photodetector provides the same absorption as a thicker substrate without the reflective layer. For example, the addition of a reflective layer may allow a sensor having a 2 µm thick substrate to have the same absorption capability as a sensor having a 4 µm thick substrate without the reflective layer.

Although only a few exemplary embodiments of this invention have been described in detail above, those skilled in the art will readily appreciate that many modifications are possible in the exemplary embodiments without material departing from the novel teachings and advantages of this disclosure. For example, though illustrated is a BSI CIS with a photodetector including a photogate structure, other embodiments, including other photodetector types, may be possible.

Thus, the present disclosure provides a backside-illuminated sensor. The backside-illuminated sensor includes a semiconductor substrate. The semiconductor substrate has a front surface and a back surface. A plurality of pixels are formed on the front surface of the semiconductor substrate. At least one pixel includes a photogate structure. The photogate structure has a gate that includes a reflective layer.

Also provided is an alternative embodiment of a back-side illuminated sensor. The sensor has a substrate with a front surface and a back surface. The sensor also has a means for sensing radiation incident on the back surface of the substrate. The sensor includes a means for reflecting radiation. The means for reflecting the radiation includes a reflective layer formed on the front surface of the substrate.

Further provided is an image sensor including a semiconductor substrate. The substrate includes a photodetector having a reflective layer. The reflective layer is formed on the semiconductor substrate on a side opposite incident radiation. The incident radiation beam is to be detected by the photodetector. In an embodiment, the photodetector comprises a photogeneration region coupled to a gate.

What is claimed is:

1. A backside-illuminated sensor comprising:
    a semiconductor substrate having a front surface and a back surface, wherein the semiconductor substrate is configured such that radiation incident the back surface is sensed by a plurality of pixels formed on the front surface; and
    the plurality of pixels formed on the front surface of the semiconductor substrate, wherein at least one pixel comprises a photogate structure, the photogate structure having a gate including a reflective layer.

2. The sensor of claim 1, wherein the reflective layer is positioned on a side of the gate opposite to the semiconductor substrate.

3. The sensor of claim 1, wherein the at least one pixel includes an n-type photosensor.

4. The sensor of claim 1, wherein the reflective layer includes silicide.

5. The sensor of claim 1, wherein the reflective layer includes a silicide selected from the group consisting of nickel silicide, cobalt silicide, tungsten silicide, tantalum silicide, titanium silicide, platinum silicide, erbium silicide, and palladium silicide.

6. The sensor of claim 1, wherein the gate is a poly-silicide gate.

7. The sensor of claim 1, further comprising:
    a transfer transistor, a reset transistor, a source follower transistor, and a selector transistor.

8. The sensor of claim 1, wherein the semiconductor substrate is between approximately 2 µm and 4 µm thick.

9. A back-side illuminated sensor, comprising:
    a substrate having a front surface and a back surface;
    means for sensing radiation incident on the back surface of the substrate; and
    means for reflecting radiation, the means for reflecting the radiation including a reflective layer formed on the front surface of the substrate, wherein the reflective layer is included in a gate structure formed on the front surface of the substrate.

10. The back-side illuminated sensor of claim 9, further comprising:
    means for transferring a charge corresponding to the sensed radiation.

11. The sensor of claim 9, wherein the means for sensing radiation includes a gate structure, the reflective layer being formed on the gate structure.

12. The sensor of claim 9, wherein the reflective layer includes a silicide.

13. An image sensor comprising:
    a semiconductor substrate comprising a photodetector including a gate having gate dielectric layer and a reflective layer formed on the gate dielectric layer, wherein the reflective layer is formed on the semiconductor substrate on a side of the semiconductor substrate opposite an incident radiation beam, wherein the incident radiation beam is to be detected by the photodetector.

14. The image sensor of claim 13, wherein the photodetector comprises a photogeneration region coupled to a gate.

15. The image sensor of claim 14, wherein the reflective layer is positioned over the photogeneration region.

16. The image sensor of claim 13, wherein the reflective layer comprises at least one of a silicide and a metal.

17. The sensor of claim 1, wherein the gate further includes a gate dielectric layer underlying the reflective layer.

18. The sensor of claim 1, wherein the gate further includes a gate electrode layer underlying the reflective layer.

19. The sensor of claim 9, wherein the gate structure further includes a gate dielectric layer.

* * * * *